United States Patent [19]

Nakaizumi

[11] Patent Number: 4,672,583

[45] Date of Patent: Jun. 9, 1987

[54] DYNAMIC RANDOM ACCESS MEMORY DEVICE PROVIDED WITH TEST CIRCUIT FOR INTERNAL REFRESH CIRCUIT

[75] Inventor: Kazuo Nakaizumi, Tokyo, Japan

[73] Assignee: NEC Corporation, Tokyo, Japan

[21] Appl. No.: 620,984

[22] Filed: Jun. 15, 1984

[30] Foreign Application Priority Data

Jun. 15, 1983 [JP] Japan .............................. 58-106986
Jun. 20, 1983 [JP] Japan .............................. 58-110332

[51] Int. Cl.⁴ .............................................. G11C 7/00
[52] U.S. Cl. .................................. 365/222; 365/201; 371/21
[58] Field of Search ............... 365/222, 201, 236, 189, 365/230; 371/21

[56] References Cited

U.S. PATENT DOCUMENTS 4,347,589  8/1982  Proebsting .......................... 365/222
4,380,805  4/1983  Proebsting .......................... 371/21

FOREIGN PATENT DOCUMENTS 0019142  11/1980  European Pat. Off. ............ 365/222

Primary Examiner—James W. Moffitt
Assistant Examiner—Glenn A. Gossage
Attorney, Agent, or Firm—Sughrue, Mion, Zinn, Macpeak, and Seas

[57] ABSTRACT

A dynamic random access memory device is equipped with a test circuit for testing an internal refresh circuit. In a test mode, the content of an internal address counter is supplied to both the row of column address decoders, by which one memory cell disposed on the diagonal in a memory cell array is designated. Further, data is written into the designated memory cell from outside of the memory device, and the data stored in the designated memory cell is then read out to check whether the read-out signal is coincident with the written data.

13 Claims, 12 Drawing Figures

DYNAMIC RANDOM ACCESS MEMORY DEVICE PROVIDED WITH TEST CIRCUIT FOR INTERNAL REFRESH CIRCUIT

BACKGROUND OF THE INVENTION

The present invention relates to a semiconductor dynamic random access memory device having an internal refresh circuit, and more particularly to a test circuit for testing the operation of the internal refresh circuit.

The dynamic memory devices most widely used at present employ a large array of so-called "one-transistor dynamic memory cells" consisting of one IGFET (insulated gate field effect transistor) such as a MOS (metal oxide semiconductor) transistor, and one storage capacitor. Since the one-transistor memory cell is very small, a large-capacity memory device can be manufactured cheaply. However, the storage capacitors leak stored voltage. For this reason, each row line of the memory cell array should be accessed periodically to restore data in the memory cells. That is, the stored data should be refreshed.

From this purpose, the row address supplied to the memory device is changed by an externally provided address counter in synchronism with a row address strobe signal $\overline{RAS}$, by which each row line of the memory cell array is accessed. This refresh mode is called $\overline{RAS}$-refresh.

There is also a refresh mode called "internal refresh", in which an internal refresh circuit is provided in the memory device to produce a row address, and the memory cells connected to each row line are refreshed. This internal refresh circuit, which is widely used in memory devices, comprises a refresh timing circuit, an internal address counter and a timer circuit. The refresh timing circuit is controlled by the logic level at a refresh terminal which is provided for enabling the internal refresh mode. When the refresh terminal receives an enabling signal, the refresh timing circuit supplies the content of the internal address counter to a row address decoder as a row address, and thereby one row line of the memory cell array is accessed. The data stored in the memory cells connected to the accessed row line are read out and are then amplified by sense amplifiers, so that data identical to the read-out data are restored. When the data are restored, i.e., when the refresh operation is completed, the content of the internal address counter is increased or decreased by one, and the memory device stands by for a subsequent refresh operation. When the enabling level at the refresh terminal is inverted to be disabling, the internal refresh circuit is deactivated. Accordingly, memory operations, i.e., data read-out or data writing, are possible. When the refresh terminal receives an enabling signal again, the above-mentioned internal refresh operation is again carried out. Thus, the internal refresh operation is performed every time the refresh terminal receives an enabling signal, and therefore such a refresh mode is called "pulse-refresh operation". On the other hand, when the refresh terminal continuously receives an enabling signal, the timer circuit is activated to produce a refresh-request signal in a predetermined cycle. In response to this refresh-request signal, the refresh timing circuit supplies the increased or decreased content of the internal address counter to the row address decoder. As a result, the above-mentioned refresh operation is carried out, and the content of the internal address counter is further increased or decreased by one. As long as the refresh terminal receives an enabling signal, the timer circuit produces the refresh-request signal. Such a refresh mode is called a "self-refresh operation" in contrast to the pulse-refresh operation.

As described above, in memory devices having the internal refresh circuit, the content of the internal address counter is supplied to the row address decoder as a row address by sending an enabling signal to the refresh terminal, and the memory cells connected to the selected row line are refreshed. Accordingly, it is important for such a memory device that the internal refresh circuit operates accurately. Otherwise, the data stored in the memory cell may be destroyed and different data may replace it.

To test the operation of the internal refresh circuit, the prior art has utilized a decrease in the voltage stored in the storage capacitor of the memory cell due to the leak. The voltage stored in the storage capacitor is decreased, as a function of time, until it cannot be recognized whether the stored data is "1" or "0". The length of time necessary for the voltage to be lowered to such a level is called the "data-hold time". Even if the data-hold time is exceeded, the data stored in the memory cell is held by refreshing the memory cell periodically. Therefore, in the prior art, a "1" is written in all of the memory cells, and then the memory device is brought into the internal refresh mode to carry out the pulse-refresh operation or the self-refresh operation for a time exceeding the data-hold time. For the duration of the internal refresh mode, the row line selected by the internal address counter is changed in order each time the refresh terminal receives an enabling signal in the pulse-refresh operation, and also each time the timer circuit produces the refresh-request signal in the self-refresh operation, so that the memory cells connected to each row line are refreshed. When the internal refresh mode is completed, the data stored in all of the memory cells are read out. If "0" is read out, the internal refresh circuit is judged to be inaccurate. Next, the data "0" is written into all of the memory cells, and the data is then read out of the respective memory cells after the internal refresh operation is completed. If the data "1" is read out, the internal refresh circuit is judged to be inaccurate.

The aforementioned prior art takes a relatively long time to test the internal refresh circuit. Specifically, the data-hold time of the memory cell is twenty to thirty seconds at room temperature. Accordingly, the internal refresh operation should be maintained for more than thirty seconds, so that the test time required for one memory device is more than one minute. The data-hold time is shortened in accordance with the increase in the ambient temperature. Accordingly, the test will end in several seconds if the test in operation of the internal refresh circuit is carried out at high temperature. However, special equipment for testing at high temperature is necessary. In addition, device characteristics caused by high temperatures influence the test.

In other words, prior art memory devices have not been equipped with circuits for testing the operation of the internal refresh circuits, necessitating the aforementioned relatively long test.

SUMMARY OF THE INVENTION

It is, therefore, one object of the present invention to provide a memory device equipped with a test circuit for testing the circuit operation of an internal refresh circuit.

It is another object of the present invention to provide a memory device having a test circuit to reduce the test time of an internal refresh circuit.

It is still another object of the present invention to provide a method of testing quickly the circuit operation of an internal refresh circuit in a memory device.

According to the present invention, there is provided a memory device comprising a memory cell array having a plurality of memory cells, a row address decoder selecting one word line in the memory cell array in response to row address signals, a column address decoder selecting one digit line in response to column address signals, an internal refresh circuit having an address counter and refreshing the memory cell connected to the word line selected by the row address decoder in response to the content of the address counter, means for periodically producing a test signal in a test mode, means responsive to the test signal for supplying both of the row and column address decoders with the content of the address counter as the row and column address signals to designate one of the memory cells, means for producing a write-enable signal, means for producing a read-enable signal, means responsive to the test signal and the write-enable signal for writing data into the designated memory cells, means responsive to the test signal and the read-enable signal for reading out data stored into the designated cell, and means for changing the content of the address counter after the data is written into or read out from the designated memory cell.

Thus, one feature of the present invention is that in the test mode, the content of the address counter is supplied to both the row and the column address decoders. Accordingly, one memory cell disposed at the intersection of the word and digit lines respectively selected by the row and column decoders is designated. Further, the content of the address counter is used as the row and column address signal, and hence the row address is the same as the column address. In other words, the designated memory cells are those on the diagonal in the memory cell array. In the internal refresh circuit's normal pulse-refresh and self-refresh operations, the content of the internal address counter is used only as the row address signal, and the column decoder is deactivated. Accordingly, it is impossible to designate one memory cell, and data is not stored in the memory cell from outside the memory device.

In the memory device according to the present invention, data is stored into the designated memory cell and read out from the same cell in response to a test signal. This is another feature of the present invention. The data-write and data read-out operations in the test mode are carried out by the internal refresh circuit. Therefore, the operation of the internal refresh circuit is tested.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 1:
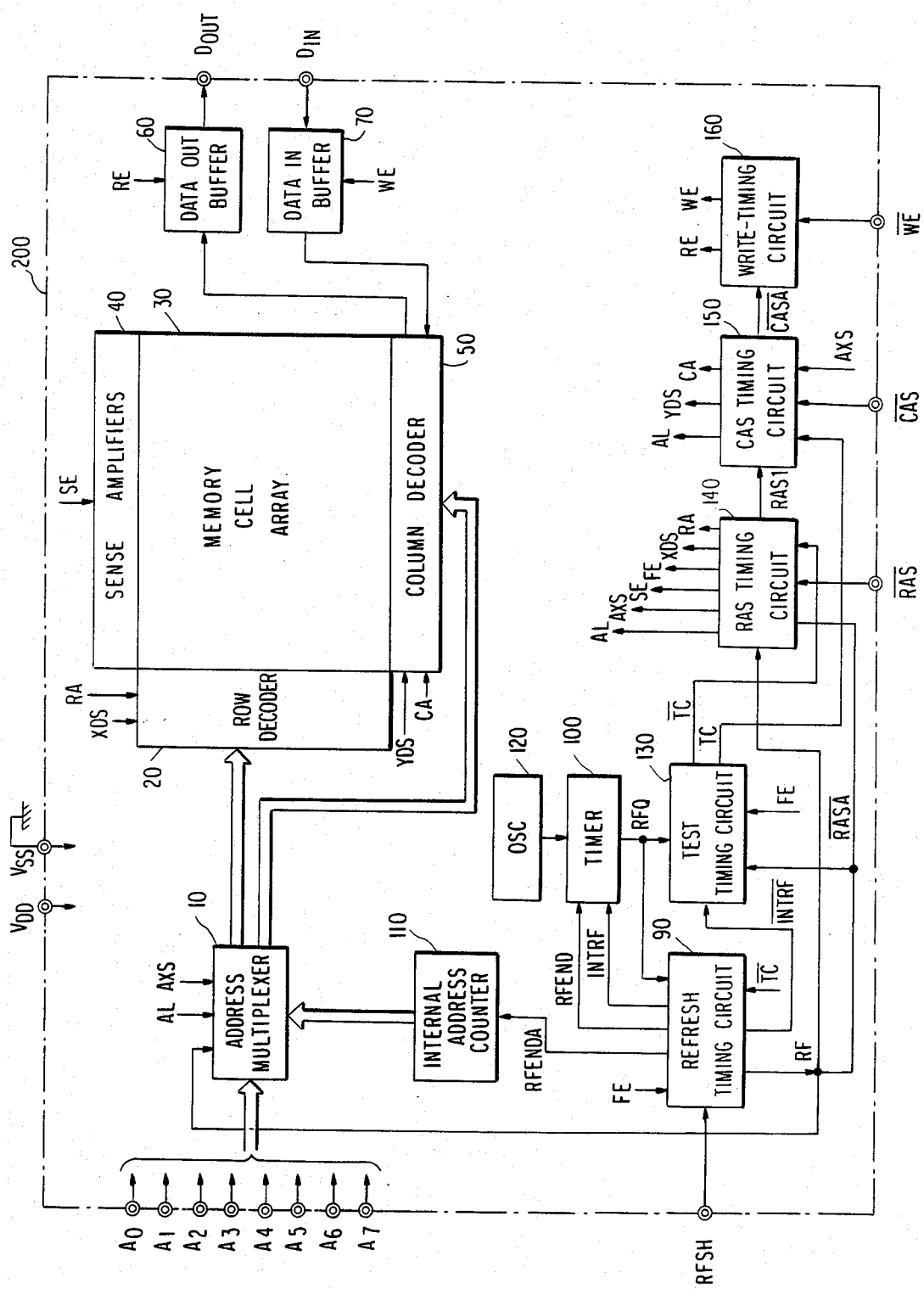
FIG. 1 is a block diagram showing a preferred embodiment of the present invention.

FIG. 1 shows a memory device according to a preferred embodiment of the present invention. This memory device is formed as an integrated circuit device 200 having a plurality of address input terminals $A_0$ to $A_7$ (eight terminals in this embodiment), a refresh terminal $\overline{RFSH}$ a row address strobe terminal $\overline{RAS}$, a column address strobe terminal $\overline{CAS}$, a write-enable terminal $\overline{WE}$, a data output terminal $D_{OUT}$, a data input terminal $D_{IN}$, a first power supply terminal $V_{DD}$ supplied with a positive voltage, and a second power supply terminal $V_{SS}$ supplied with a ground potential. The construction of this memory device will be described below along with data-read and data-write operations, pulse-refresh and self-refresh operations, and a test operation of an internal refresh circuit.

When a row address strobe signal supplied to the terminal $\overline{RAS}$ is inverted from a high level to a low level, the data read-out operation or the data-write operation is started. An RAS timing circuit 140 generates an address latch signal AL having one-shot pulse shape in response to the low-level row address strobe signal. This signal AL is supplied to an address multiplexer 10, so that address signals applied to the address terminals $A_0$ to $A_7$ are introduced as a row address. A signal AXS generated from the RAS timing circuit 140 is used for latching the address signals as a row address into flip-flop circuits (not shown) in the address multiplexer 10, and takes a deactivating level in response to the latching of the address signals. The latched address signals are supplied to a row address decoder 20. The RAS timing circuit also generates two signals XDS and RA for activating the row decoder 20. The row decoder 20 is activated in response to the signals CDS and RA and selects one row line, i.e., one word line of a memory cell array 30 corresponding to the row address signals. The memory cell array 30 includes a plurality of word (row) lines, a plurality of digit (column) lines, and a plurality of memory cells coupled between the respective word lines and the respective digit lines, each of the memory cells consisting of one transistor and one storage capacitor. Accordingly, the data stored in the memory cells connected to the selected word line are read out on a plurality of column lines. i.e., digit lines. The RAS timing circuit 140 generates a sense-enable signal SE for activating sense amplifiers 40. The sense amplifiers 40 amplify the readout data on the respective digit lines in response to the signal SE, and restore the same data in the memory cells.

The RAS timing circuit 140 supplies the signal AXS, and also a signal RAS1 to a CAS timing circuit 150. The signals RAS1 and AXS respectively take an activating level and a deactivating level when the row address strobe signal applied to the terminal $\overline{RAS}$ takes a low level, and thereby the CAS timing circuit 150 is brought into an operable condition. Under this condition, when the column address strobe signal supplied to the terminal $\overline{CAS}$ takes a low level, the $\overline{CAS}$ timing circuit 150 generates a one-shot pulse signal AL. In response to the signal AL, the address multiplexer 10 introduces the address signals supplied to the address input terminals $A_0$ to $A_7$ as a column address to supply it to a column address decoder 50. At this time, the signal AXS is in a deactivating level, and therefore, the signal conditions of the flip-flop circuits in the address multiplexer 10 latching the row address signals are not changed. The CAS timing circuit 150 also produces two signals YDS and CA for activating the column decoder 50. The column decoder 50 selects one column line, i.e., one digit line corresponding to the column address signals in response to the signals YDS and CA. As a result, the memory cell is designated, which is disposed at the intersection of the word line selected by the row decoder 20 and the digit line selected by the column decoder 50. The CAS timing circuit 150 further generates a signal $\overline{CASA}$ used for activating a write-timing circuit 160.

Whether the data is read out of the designated memory cell or written into the same memory cell is controlled by a write-enable signal supplied to the terminal $\overline{WE}$. When the write-timing circuit 160 is activated by the signal $\overline{CASA}$ and the terminal $\overline{WE}$ is held at a high level, the circuit 160 produces a high read-enable signal RE and a low write-enable signal WE. Accordingly, a data output buffer 60 is activated, and a data input buffer 70 is deactivated. As a result, the data stored in the designated memory cell is supplied at the data output terminal $D_{OUT}$. In contrast, when the terminal $\overline{WE}$ takes a low level, data supplied to the data input terminal $D_{IN}$ is written into the designated memory cell through the data input buffer 70.

As apparent from the above description, the internal refresh circuit having a refresh timing circuit 90, a timer circuit 100 and an internal address counter 110, and a test timing circuit 130 for testing the operation of the internal refresh circuit is inactive when data is read from or written to the memory cell array 30. An oscillator 120 operates in order to generate a predetermined bias voltage to a semiconductor substrate on which the memory device of FIG. 1 is formed.

The internal refresh circuit is activated when the signal at the terminal $\overline{RAS}$ is held at a high level and that at the refresh terminal $\overline{RFSH}$ is supplied at a low level. When the signal at the terminal $\overline{RFSH}$ takes a low level, the refresh timing circuit 90 generates a refresh signal RF. This signal RF is supplied to the address multiplexer 10 and the RAS timing circuit 140. The address multiplexer 10 switches over its input ends from the address input terminals $A_0$ to $A_7$ to the internal address counter 110, in response to the signal RF. Further, the signal AXS is held at an activating level. Consequently, the content of the internal address counter 110 is latched into the flip-flop circuits in the address multiplexer 10 as a row address to be supplied to the row decoder 20, and further supplied to the column decoder 50 as a column address. The RAS timing circuit 140 generates the signals XDS and RA for activating the row decoder 20 in response to the signal RF, and further outputs the signal RAS1 to the CAS timing circuit 150 at an activating level. It should be noted that the CAS timing circuit 150 operates when the signals RAS1 and AXS take an activating level and a deactivating level, respectively. The signal AXS is held at an activating level by the signal RF from the refresh timing circuit 90. Therefore, the CAS timing circuit 150 is in a deactivated condition, and so does not produce the signals YDS, CA and $\overline{CASA}$. Consequently, the column decoder 50 and the write-timing circuit 160 are not activated. Since the row decoder 20 is activated by the signal XDS and RA, one word line (row line) is selected in response to the content of the internal address counter 110. The RAS timing circuit 140 also produces the sense-enable signal SE to activate the sense amplifiers 40, so that the data stored in the memory cells connected to the selected word line are amplified by the sense amplifiers 40, and the same data are restored. That is, the internal refresh operation is carried out. When the refresh operation is completed, the refresh timing circuit 90 generates refresh-end signals RFEND and RFENDA in response to a signal FE from the RAS timing circuit 140, and outputs the signal RF at a deactivating level. The signal RFENDA is supplied to the internal address couter 110 to increase its content by one. The content of the internal address couter 110 may also be decreased. The signal RFEND is supplied to the timer circuit 100 and is used for starting a timer operation. The timer circuit 100 is further supplied with a signal INTRF from the refresh timing circuit 90. The signal INTRF is generated when the terminal $\overline{RFSH}$ takes a low level, and takes a deactivating level when the terminal $\overline{RFSH}$ inverted to a high level. Accordingly, the timer circuit 100 does not operate when the terminal $\overline{RFSH}$ is inverted from a low level to a high level. As a result, the internal refresh circuit refreshes only one group of memory cells connected to the selected word line, and then stops. When the terminal $\overline{RFSH}$ takes a low level again, the increased (or decreased) content of the internal address counter 110 is supplied to the row decoder 20 as a new row address, so that the next word line is selected to refresh the memory cells connected to this word line. Thus, every time the terminal $\overline{RFSH}$ is inverted to a low level, the selected word line is shifted in order, so that the pulse-refresh is attained.

When the terminal $\overline{RFSH}$ is maintained at a low level, the signal INTRF is continuously supplied to the timer circuit 100. Accordingly, the timer circuit 100 starts its time counting operation in response to the signal RFEND and generates a refresh-request signal RFQ after the passage of a predetermined time. In response to this signal RFQ, the refresh timing circuit 90 inverts again the signal RF to a high level, so that the content of the counter 110, increased by one, is supplied to the row decoder 20. In accordance with the aforementioned refresh operation, the memory cells connected to the selected word line are refreshed, and the signals RFEND and RFENDA are then produced. Consequently, the content of the counter 110 is further increased by one, and the timer circuit 100 starts its time counting operation. The further increased content of the internal address counter 110 is supplied to the row decoder 20 in response to the refresh-request signal RFQ, and the internal refresh operation is carried out. As long as the terminal $\overline{RFSH}$ is maintained at a low level, the self-refresh operation is continued.

In order to test quickly the internal refresh circuit's operation, the test timing circuit 130 is provided, and further the construction for a test operation is added into the refresh timing circuit 90, the RAS timing circuit 140 and the CAS timing circuit 150. Before describing the testing operation, the construction of the circuit for the test will be explained below.

Figure 2:
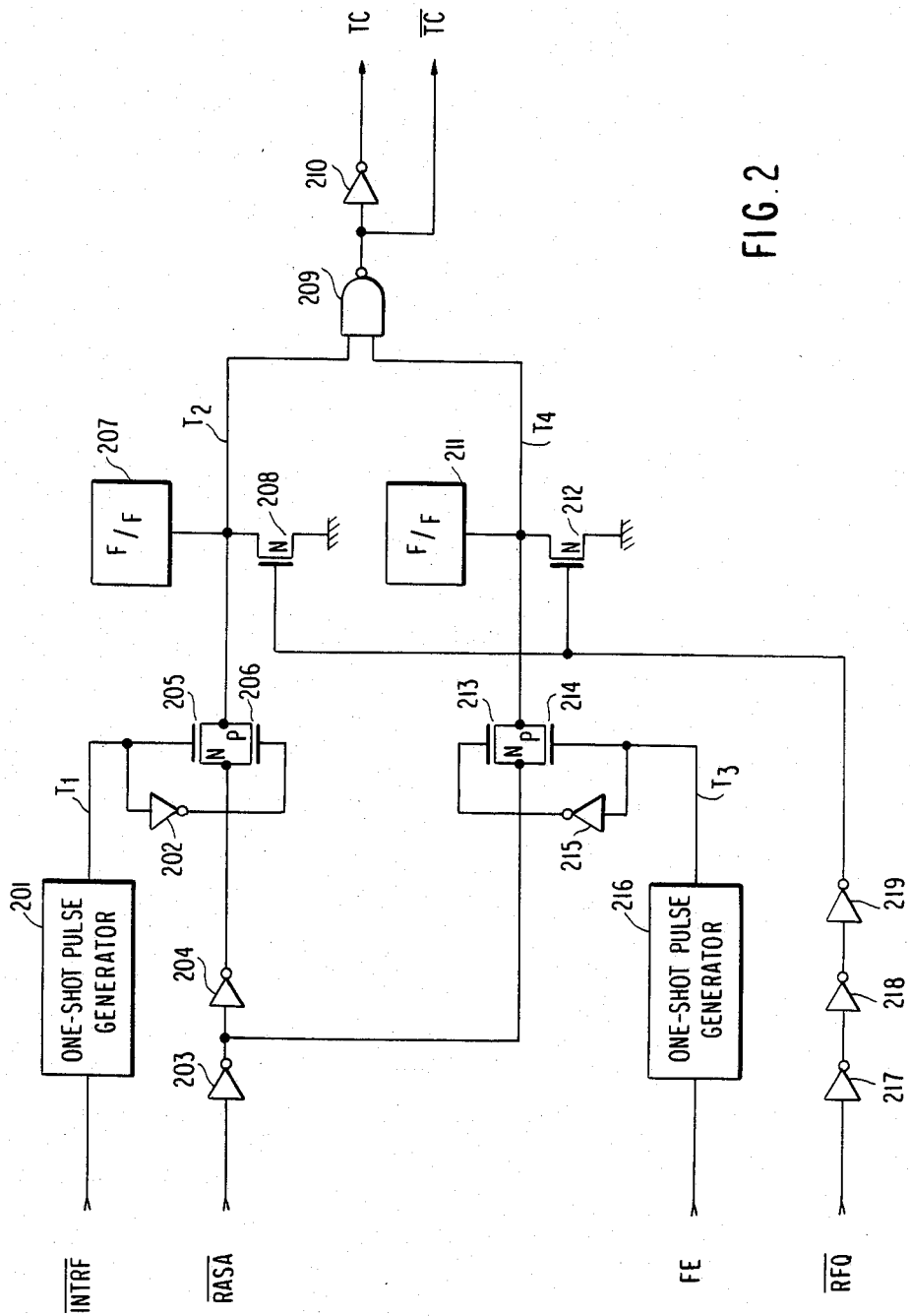
FIG. 2 is a circuit diagram showing a test timing circuit 130 in FIG. 1.

FIG. 2 shows the detailed circuit diagram of the test timing circuit 130. This circuit 130 receives the signal $\overline{\text{INTRF}}$ from the refresh timing circuit 90, the signals $\overline{\text{RASA}}$ and FE from the RAS timing circuit 140 and the refresh-request signal $\overline{\text{RFQ}}$ from the timer circuit 100, as also shown in FIG. 1, and generates test signals TC and $\overline{\text{TC}}$ of opposite phase. The signal $\overline{\text{INTRF}}$ is applied to a first one-shot pulse generator 201 whose output is supplied to the gate of a N-channel MOS transistor 205 and to the gate of a P-channel MOS transistor 206 through an inverter 202. The transistors 205 and 206 constitute a first transmission gate, the input end of which is supplied with the signal $\overline{\text{RASA}}$ through two inverters 203 and 204. The output end of the first transmission gate is connected to a flip-flop (F/F) circuit 207, and further connected to one input end of a NAND circuit 209. The signal FE is supplied to a second one-shot pulse generator 216 whose output is supplied to the gate of a P-channel MOS transistor 214 and to the gate of an N-channel MOS transistor 213 through an inverter 215. The transistors 213 qand 214 constitute a second transmission gate, the input end of which is supplied with the signal $\overline{\text{RASA}}$ through the inverter 203. The output end of the second transmission gate is connected to a F/F circuit 211 and the other input end of the NAND circuit 209. The F/F circuits 207 and 211 are reset by N-channel MOS transistors 208 and 212, respectively, the gates of which are supplied with the signal $\overline{\text{RFQ}}$ through three inverters 217 to 219. The signal $\overline{\text{TC}}$ is derived from the output end of the NAND circuit 209, and the signal TC is further derived through an inverter 210.

Figure 3:
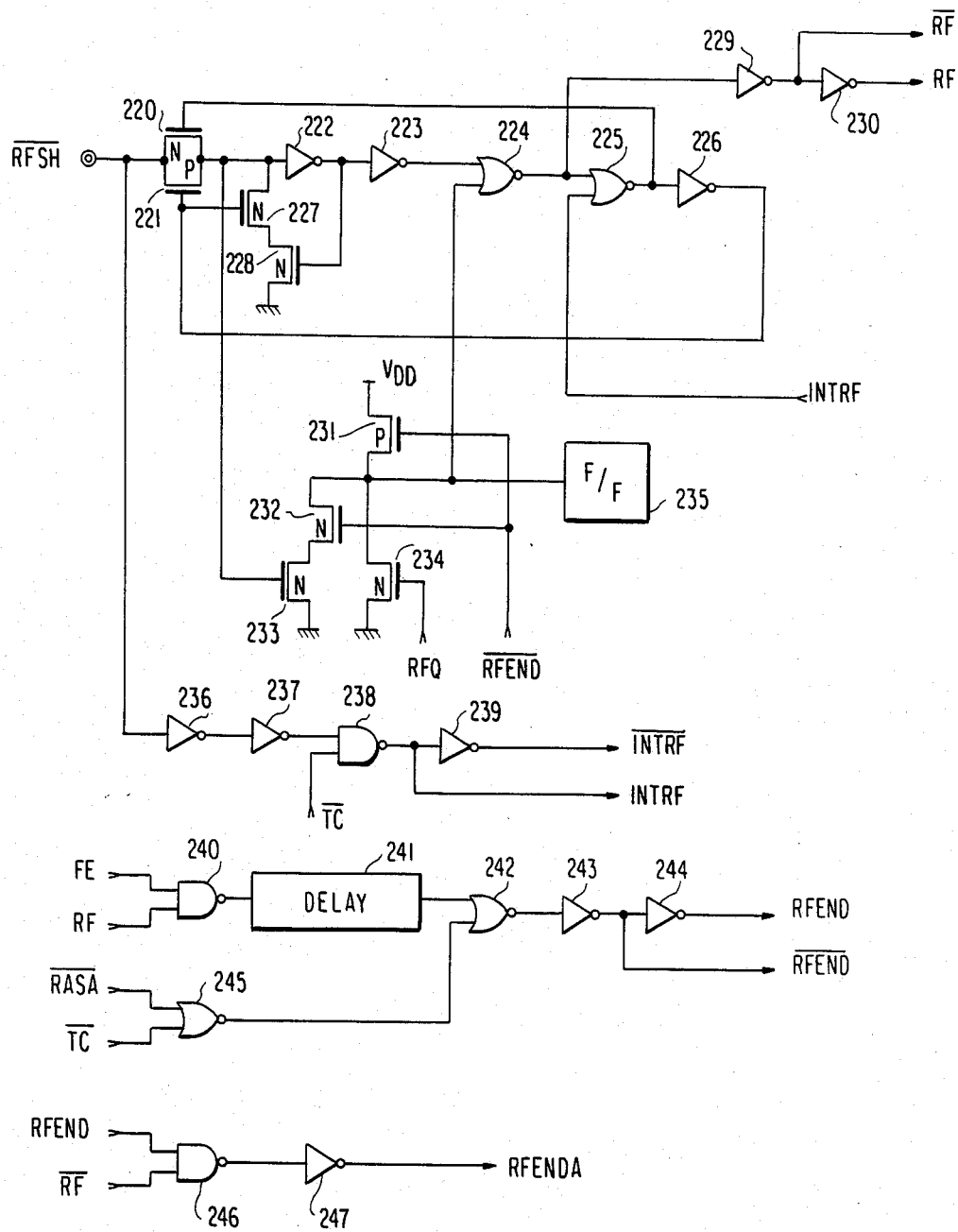
FIG. 3 is a circuit diagram showing a refresh timing circuit 90 in FIG. 1.

FIG. 3 is a circuit diagram showing the refresh timing circuit 90. The refresh terminal $\overline{\text{RFSH}}$ is connected to the input end of a transmission gate composed of an N-channel MOS transistor 220 and a P-channel MOS transistor 221, and further connected to one input end of a NAND circuit 238 through two inverters 236 and 237. The other input end of the NAND circuit 238 is supplied with the signal $\overline{\text{TC}}$ from the test timing circuit 130. The signal INTRF is derived from the output end of the NAND circuit 238, and the signal $\overline{\text{INTRF}}$ is further derived through an inverter 239. The output end of the transmission gate is connected through two inverters 222 and 223 to one input end of a NOR circuit 224 whose output end is connected to one input end of a NOR circuit 225 and further connected to an inverter 229. The signal $\overline{\text{RF}}$ is derived from the inverter 229, and the signal RF is further derived through an inverter 230. The output end of the NOR circuit 225 is connected to the gate of the transistor 220 and further connected to the gate of the transistor 221 through an inverter 226. The other input end of the NOR circuit 225 is supplied with the signal INTRF. Two N-channel MOS transistors 227 and 228 are connected in series between the input end of the inverter 222 and the ground. The gate of the transistor 227 is connected to the gate of the transistor 221, and the gate of the transistor 228 is connected to the output end of the inverter 222. A P-channel MOS transistor 231 and an N-channel MOS transistor 234 are connected in series between the power supply terminal $V_{DD}$ and the ground, and a series circuit of two N-channel MOS transistors 232 and 233 is connected in parallel to the transistor 234. The other input end of the NOR circuit 224 is connected to the connection point of the transistors 231 and 234, and a F/F circuit 235 is also connected to the connection point. The signal $\overline{\text{RFEND}}$ is supplied to the gates of the transistors 231 and 232, and the signal RFQ is supplied to the gate of the transistor 234. The gate of the transistor 233 is connected to the input end of the inverter 222. The signal RF and the signal FE from the RAS timing circuit 140 are supplied to a two-input NAND circuit 240, the output of which is connected to one input end of a NOR circuit 242 through a delay circuit 241. The delay circuit 241 may comprise a plurality of inverters connected in series. The signal $\overline{\text{RASA}}$ from the RAS timing circuit 140 and the signal $\overline{\text{TC}}$ from the test timing circuit 130 are supplied to a two-input NOR circuit 245, the output end of which is connected to the other input end of the NOR circuit 242. The output of the NOR circuit 242 serves as the signal $\overline{\text{RFEND}}$ through an inverter 243, and further serves as the signal RFEND through two inverters 243 and 244. The signals RFEND and $\overline{\text{RF}}$ are supplied to a two-input NAND circuit 246. The signal RFENDA is derived from the output of the NAND circuit 246 through an inverter 247.

Figure 4:
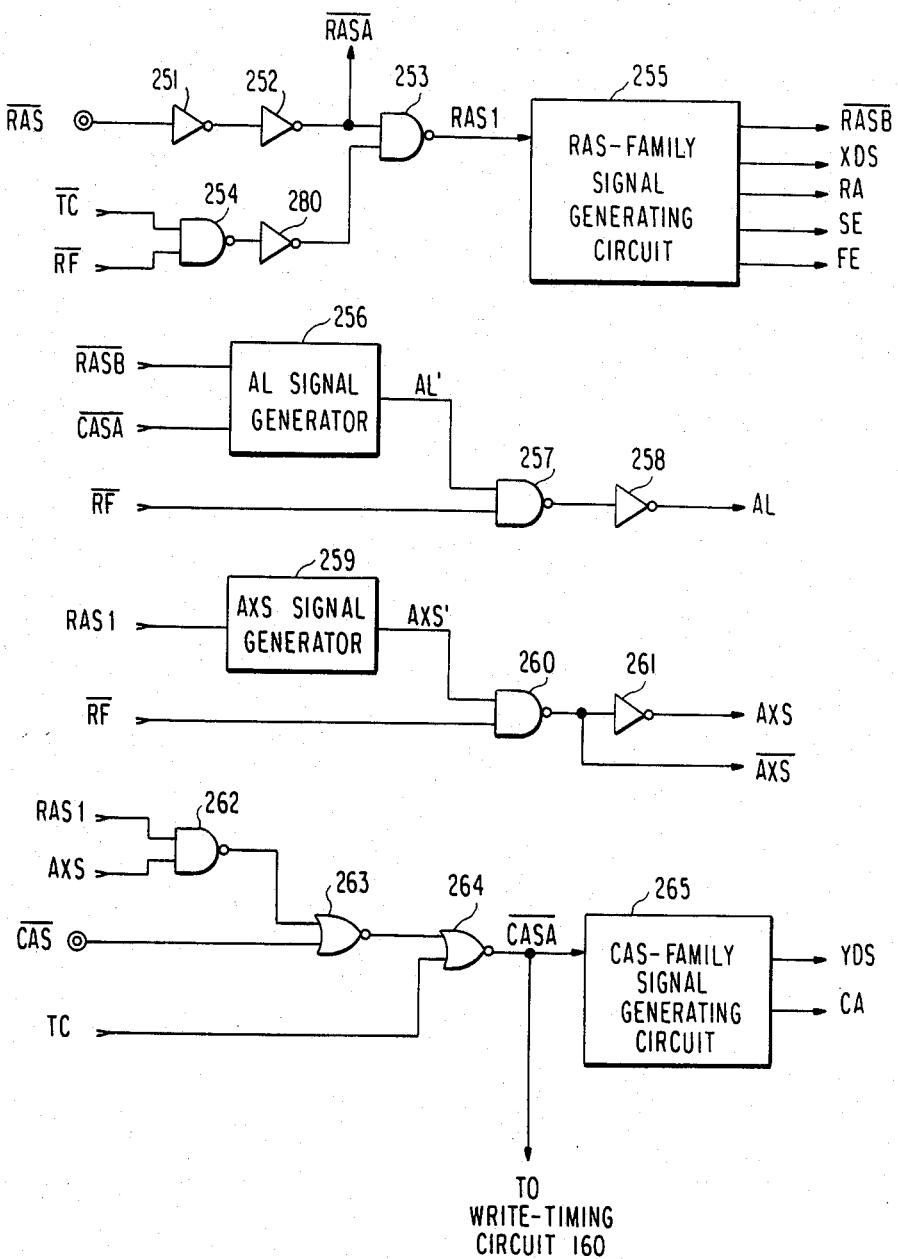
FIG. 4 is a circuit diagram showing RAS and CAS timing circuits 140 and 150 in FIG. 1.

FIG. 4 shows parts of the RAS and CAS timing circuits 140 and 150 including a construction added for a test operation. The terminal $\overline{\text{RAS}}$ is connected to one input end of a NAND circuit 253 through 251 and 252. The signal $\overline{\text{RASA}}$ is derived from the inverter 252. The signal TC from the test timing circuit 130 and the signal $\overline{\text{RF}}$ from the refresh timing circuit 90 are supplied to a two-input NAND circuit 254, the output of which is connected to the other input end of the NAND circuit 253 through an inverter 280. The signal RAS1 is derived from the NAND circuit 253 and supplied to a RAS-family signal generating circuit 255. In response to the signal RAS1, the circuit 255 generates a signal $\overline{\text{RASB}}$ used for making the signal AL, the signals XDS and RA for activating the row decoder 20, the signal SE for enabling the sense amplifiers 40, and the signal FE supplied to the test timing circuit 130 and the refresh timing circuit 90. An AL signal generator 256 generates a signal AL having a one-shot pulse shape in response to the signal $\overline{\text{RASB}}$. This signal AL is supplied to one input end of a NAND circuit 257, the other input end of which is supplied with the signal $\overline{\text{RF}}$ from the refresh timing circuit 90. The output of the NAND circuit 257 is supplied to an inverter 258 to derive the signal AL supplied to the address multiplexer 10. An AXS signal generator 259 generates a signal AXS in response to the signal RAS1 and supplies it to one input end of a NAND circuit 260. The other input end of the NAND circuit 260 is supplied with the signal $\overline{\text{RF}}$. The signal $\overline{\text{AXS}}$ is outputted from the NAND circuit 260, and the signal AXS is further outputted through an inverter 261. These signals AXS and $\overline{\text{AXS}}$ are supplied to the address multiplexer 10.

The signals RAS1 and AXS are supplied to a two-input NAND circuit 262 having its output end connected to one input end of a NOR circuit 263. The terminal $\overline{\text{CAS}}$ is connected to the other input end of the NOR circuit 263. The output end of the NOR circuit 263 is connected to one input end of a NOR circuit 264 having the other input end supplied with the signal TC from the test timing circuit 130. The output of the NOR circuit 264 serves as the signal $\overline{\text{CASA}}$ supplied to the write-timing circuit 160. In response to the signal $\overline{\text{CASA}}$, a CAS-family signal generating circuit 265 generates the signals YDS and CA for activating the column decoder 50, and further the AL signal generator 256 generates the signal AL.

Figure 5:
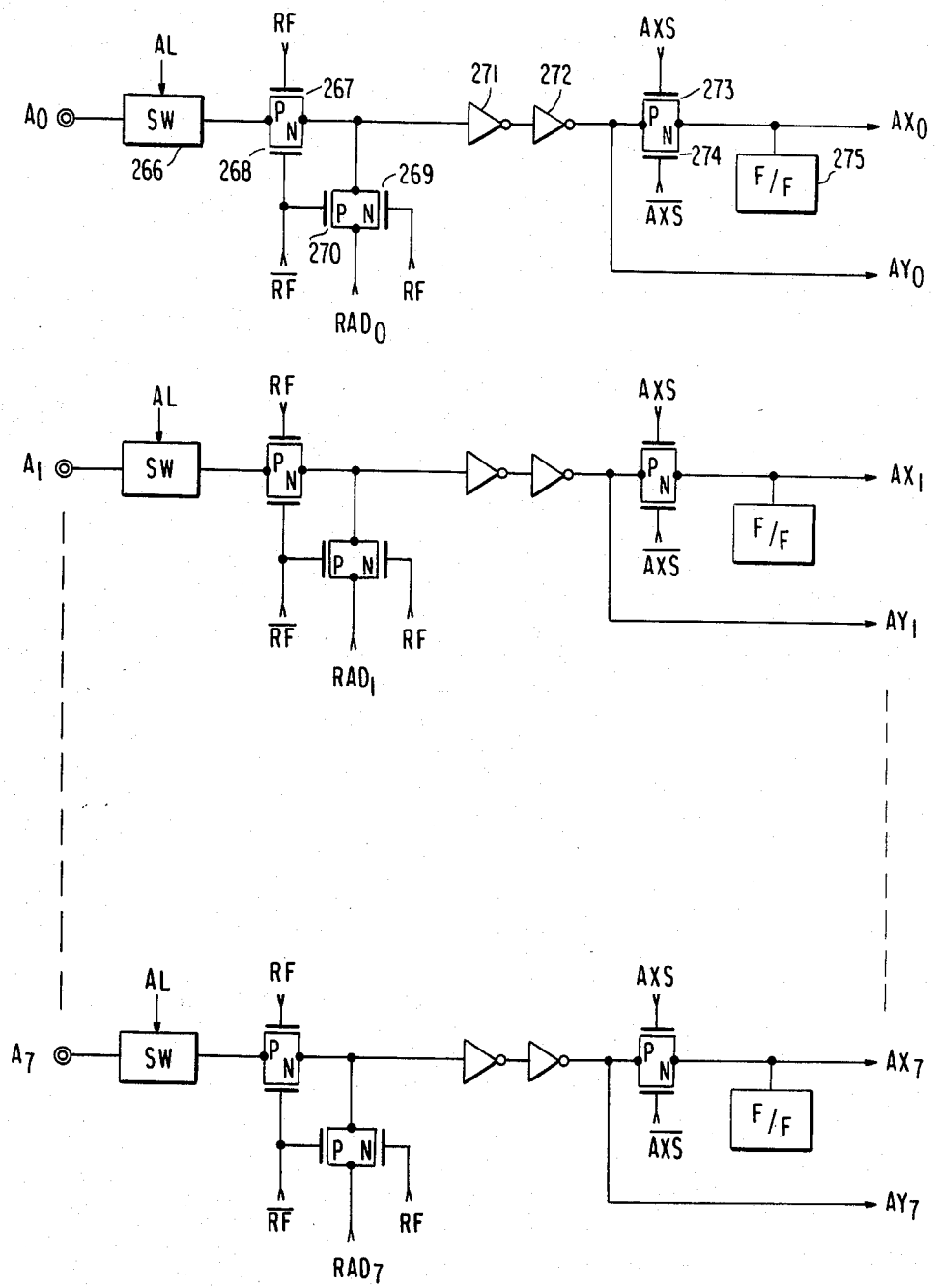
FIG. 5 is a circuit diagram showing an address multiplexer 10 in FIG. 1.

A detailed circuit diagram of the address multiplexer 10 is shown in FIG. 5. As apparent from this Figure, the circuit constructions provided for the respective address input terminals $A_0$ to $A_7$ are the same, and hence only the circuit provided for the terminal $A_0$ will be described. The terminal $A_0$ is connected to a switch circuit 266 controlling whether the address signal supplied to the terminal $A_0$ is introduced or not. The switch circuit 266 is controlled by the signal AL generated from the RAS and CAS timing circuits 140 and 150, and is switched on to introduce the signal to the terminal $A_0$ when the signal AL takes a high level. The output of the switch circuit 266 is supplied to a first transmission gate composed of a P-channel MOS transistor 267 and an N-channel MOS transistor 268. The gates of the transistors 267 and 268 are supplied with the signals RF and $\overline{RF}$ from the refresh timing circuit 90, respectively. The signals RF and $\overline{RF}$ are further supplied to the gates of an N-channel MOS transistor 269 and a P-channel MOS transistor 270, respectively. The transistors 269 and 270 constitute a second transmission gate, the input end of which is supplied with an output signal $RAD_0$ from the internal address counter 110 (FIG. 1) corresponding to the address input terminal $A_0$. The output ends of the first and second transmission gates are connected in common to a buffer composed of two inverters 271 and 272. The output of this buffer is used as a column address signal $AY_0$. The output of the inverter 272 is further supplied to a third transmission gate composed of a P-channel MOS transistor 273 and an N-channel MOS transistor 274. The output of the third transmission gate is latched by an F/F circuit 275 and used as a row address signal $AX_0$. The gates of the transistors 273 and 274 are supplied with the signals $\overline{AXS}$ and AXS from the RAS timing circuit 140, respectively.

The memory device having the aforementioned circuit construction is brought into a test mode when the refresh terminal $\overline{RFSH}$ and the row address strobe terminal $\overline{RAS}$ take such a combination of logic levels as is inhibited during normal operation (i.e. the data read-out operation, the data-write operation, the pulse-refresh operation and the self-refresh operation). The operation in test mode will be described in detail with reference to FIG. 6. When the terminal $\overline{RFSH}$ is inverted to a low level, the signals INTRF and $\overline{INTRF}$ are inverted into a high level and a low level, respectively, as apparent from the circuit diagram of the refresh timing circuit 90 as shown in FIG. 3. The transistors 232 and 233 are made conducting, while the transistor 231 is made nonconducting before the terminal $\overline{RFSH}$, is inverted into a low level, so that the F/F circuit 235 holds a low level. Accordingly, in response to the inversion of the terminal $\overline{RFSH}$ to a low level, the NOR circuit 224 generates a high level output, so that the signals RF and $\overline{RF}$ take a high level and a low level, respectively. Since the signal INTRF takes a high level, the output of the NOR circuit 225 is inverted to a low level to turn the transistors 220 and 221 off. However, the transistors 227 and 228 are made conducting, and hence the input end of the inverter 222 is held at a low level by the closed loop circuit composed of the transistors 227 and 228 and the inverter 222. Though the transistor 231 is made nonconducting, the other input end of the NOR circuit 224 is held at a low level by the F/F circuit 235, and thereby the signal RF is maintained at a high level.

Since the signal $\overline{RF}$ takes a low level, the signal AL is inverted to a low level and the signals AXS and $\overline{AXS}$ are apparent from FIG. 4. As a result, the switch circuit 266 (FIG. 5) in the address multiplexer 10 is switched off, and the address signals supplied to the address input terminals $A_0$ to $A_7$ are not introduced into the memory device. In addition, the signals RF and $\overline{RF}$ take a high level and a low level, respectively, and hence the transistors 267 and 268 are made nonconducting and the transistors 269 and 270 are made conducting. As a result, the signals $RAD_0$ to $RAD_7$ $p_k$ *from the internal address counter* 110 *are introduced as address signals. Since the signals AXS and $\overline{AXS}$ take a low level and a high level, respectively, the transistors* 273 *and* 274 *are brought into a conducting state, so that the contents of the internal address counter* 110 *are supplied to the column decoder* 50 *as column address signals $AY_0$* to $AY_7$ and further supplied to the row decoder 10 as row address signals $AX_0$ to $AX_7$.

The signal $\overline{RF}$ having a low level is supplied to the NAND circuit 254 in the RAS timing circuit 140 shown in FIG. 4, and thereby the other input end of the NAND circuit 253 takes a low level. Consequently, the signal RASl takes a high level irrespective of the level at the row address strobe terminal $\overline{RAS}$, and the RAS-family signal generating circuit 255 is activated. The signal AXS having a low level is supplied to the NAND circuit 262, and the signal TC generated from the test timing circuit 130 has a low leve. Therefore, the signal $\overline{CASA}$ has a high level, so that the CAS-family signal generating circuit 265 and the write-timing circuit 160 are deactivated. The RAS-family signal generating circuit 255 generates the signals XDS and RA for activating the row decoder 20 and the signal SE for enabling sense amplifiers 40 when the signal RASl is high. As a result. one word line is selected in response to the content of the internal address counter 110, and the data stored in the memory cells connected to the selected word line is read out and then amplified by the sense amplifiers 40.

Figure 6:
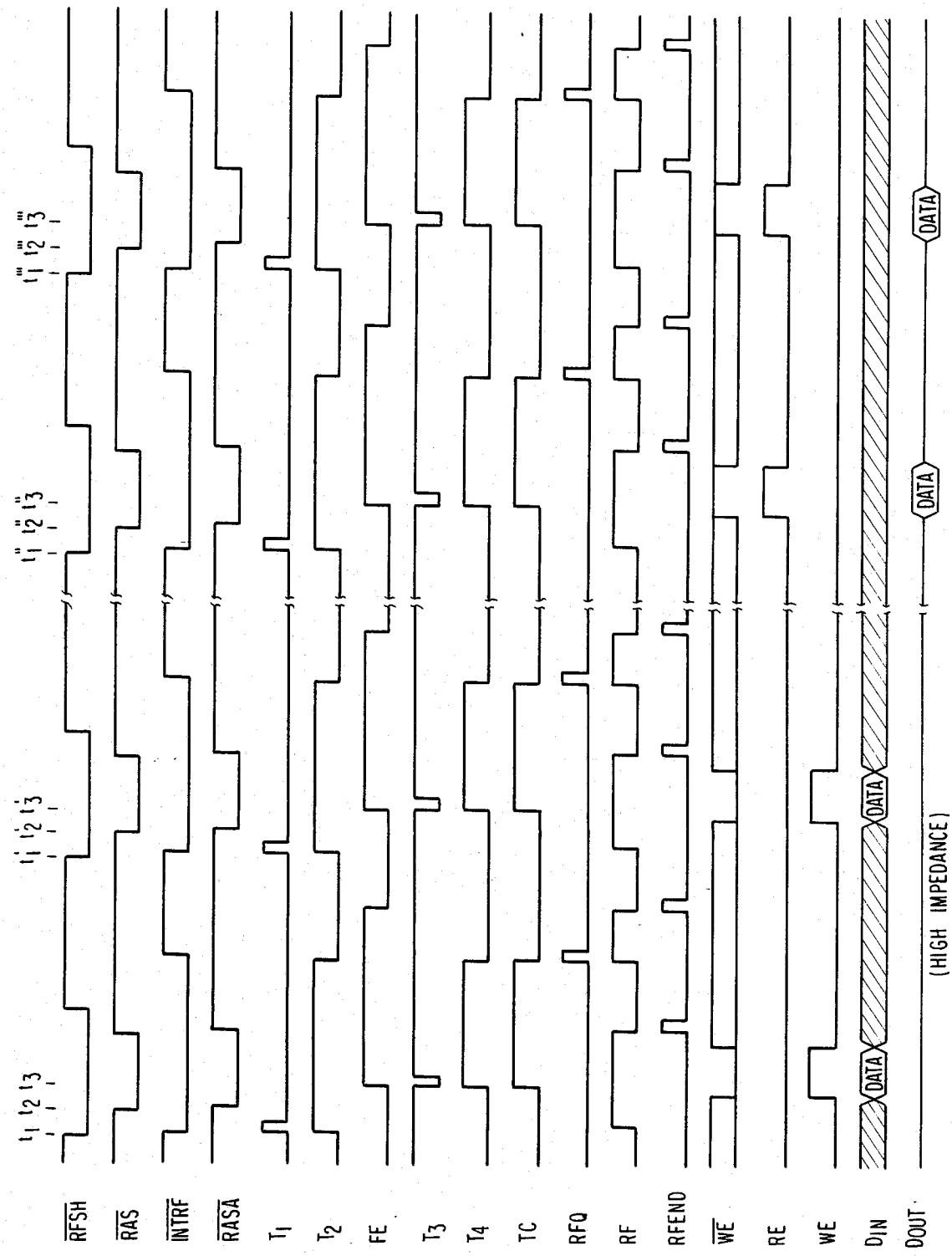
FIG. 6 is a timing chart for the invention when it is in a test mode.

In the test timing circuit 130 shown in FIG. 2, when the signal $\overline{INTRF}$ is inverted to a low level at the time point $t_1$, the one-shot pulse generator 201 generates at its output end a one-shot pulse signal $T_1$ having a high level, as shown in FIG. 6. Consequently, the transistor 205 and 206 are turned on, and the level of the signal $\overline{RASA}$ is held by the F/F circuit 207 to generate a high level $T_2$. The RAS-family signal generating circuit 255 (FIG. 4) makes the signal FE have a high level at the time point $t_3$ in response to the signal $\overline{RF}$, as shown in FIG. 6. In order to bring the memory device into the test mode, the row address strobe terminal $\overline{RAS}$ is inverted to a low level at the time point $t_2$ before the time point $t_3$. Under the normal operation, the terminal $\overline{RAS}$ is maintained at a high level. When the signal FE is inverted to a high level, the one-shot pulse generator 216 generates at its output end a one-shot pulse $T_3$ of a low level to turn the transistors 213 and 214 on. At this time, the signal $\overline{RASA}$ is inverted to a low level, and hence the F/F circuit 211 is to a high level to generate a high signal $T_4$. As a result, the signal $\overline{TC}$ from the NAND circuit 209 is inverted to a low level, an the signal TC derived from the inverter 210 is inverted to a high level.

The signal TC is supplied to the NOR circuit 264 (FIG. 4) in the CAS timing circuit 160. When the signal TC is inverted to a high level, the signal $\overline{CASA}$ is inverted to a low level, so that the CAS-family signal generating circuit 265 is activated to generate the signals YDS and CA for activating the column decoder 50.

Consequently, the column decoder 50 selects one column line (digit line) in the memory cell array 30 in response to the column address signals derived from the internal address counter 110. As shown in FIG. 5. the content of the internal address counter 110 is supplied to both of the row and column decoders 20 and 50, and hence the row address signals are the same as the column address signals. As a result, the memory cell disposed on the diagonal in the memory cell array 30 and at the intersection of the word and digit lines respectively selected by the row and column decoder 20 and 50 is designated. As described above, in the test mode, both of the row and column decoders 20 and 50 are activated, and the content of the internal address counter 110 is supplied to both of the decoders 20 and 50 to designate one memory cell disposed on the diagonal in the memory cell array 30.

The write-timing circuit 160 is activated by the signal $\overline{CASA}$ having a low level. Accordingly, the data can be written into the memory cell designated by the test mode and can be read out from the same memory cell in response to the level at the terminal $\overline{WE}$. In the test mode, the terminal $\overline{WE}$ is applied first at a low level, as shown in FIG. 6. The write-timing circuit 160 generates the signal WE at a high level and the signal RE at a low level. As a result, the data "1" is written into the designated memory cell from the data terminal $D_{IN}$.

In FIG. 3. the circuit receiving the signals FE and RF generates the signal RFEND used for increasing the contents of the internal address counter 110 by one. This circuit is further supplied with the signals $\overline{RASA}$ and $\overline{TC}$, by which the generation timing of the signal RFEND in the test mode is controlled. More specifically, assuming that the signal $\overline{RASA}$ is not supplied, when the signal FE is inverted to a high level in the test mode, the signal RFEND is inverted to a high level after a time (determined by the delay circuit 241 and the gate circuits 242 to 244) has elapsed. When the signal RFEND is at a high level, the internal address counter 110 increases its contents by one and inverts the signal RF to a low level, as mentioned hereinafter. When the signal FE is inverted to a high level, the test signal TC is generated to write data into the memory cell, as described above. For this reason, the data may not be written into the designated memory cell if the signal RFEND is inverted to a high level before the signal TC is generated. In order to prevent this mistiming, the signal $\overline{RAS}$ is supplied to the NOR circuit 245, by which the signal RFEND is not inverted to a high level until the signal $\overline{RASA}$ is inverted from a low level to a high level. In other words, the terminal $\overline{RAS}$ is held at a low level until the data write operation is completed. When the terminal $\overline{RAS}$ (i.e. the signal $\overline{RASA}$ is inverted to a high level, the signals RFEND and $\overline{RFEND}$ are inverted to a high level and a low level, respectively.

In response to the low level signal $\overline{RFEND}$, the transistor 231 in the refresh timing circuit 90 shown in FIG. 3 is made conducting. Therefore, the F/F circuit 235 is set to a high level, and the signal RF and $\overline{RF}$ are inverted to a low level and a high level, respectively. Consequently, the transistors 267 and 268 (FIG. 5) are made conducting, and the transistors 269 and 270 are made nonconducting. The content of the internal address counter 110 is not supplied to the row and column decoders 20 and 50. When the signal $\overline{RF}$ takes a high level, the output of the NAND circuit 246 (FIG. 3) takes a low level to invert the signal RFENDA to a high level. The signal RFENDA at a high level is supplied to the internal address counter 110 (FIG. 1) to increase its content by one. Accordingly, the content of the internal address counter 110 is not changed when the transistors 269 and 270 (FIG. 5) are in a conducting state. When the signal RF is inverted to a low level, the signals RFEND and $\overline{RFEND}$ are inverted again to a low level and a high level, respectively.

The signals TC and $\overline{TC}$ are not inverted even when the signals RFEND and RF are to a low level. This is because the conditions of the F/F circuits 207 and 211 (FIG. 2) are changed by the signal $\overline{RFQ}$ generated from the timer circuit 100. Accordingly, the output level of the NAND circuit 254 (FIG. 4) in the RAS timing circuit 140 is not varied, and the signal RAS1 is held at a high level. The signals AL and AXS are also maintained at a low level. Consequently, the switch circuit 266 (FIG. 5) in the address multiplexer 10 is in an open condition, and the transistors 273 and 274 are maintained in a conducting state.

The test signal $\overline{TC}$ at a low level is supplied to the NAND circuit 238 in the refresh timing circuit 90 (FIG. 3). Accordingly, the signal INTRF is held at a high level even when the terminal $\overline{RFSH}$ is inverted to a high level. It has already been mentioned that the timer circuit 100 is activated by the high level signal INTRF and starts its time counting operation in response to the high level signal RFEND. Therefore, when the signal RFEND is inverted to high level, the timer circuit 100 starts its time counting operation by using the oscillation signal generated from the oscillator 120 and generates the refresh-request signal RFQ when a predetermined period passes, as shown in FIG. 6. As a result, the transistors 208 and 212 (FIG. 2) are made conducting to send a low level signal to the F/F circuits 207 and 211, and the test signals TC and $\overline{TC}$ are inverted to a low level and a high level, respectively.

This signal RFQ also makes the transistor 234 (FIG. 3) conducting, so that a low level signal is held in the F/F circuit 235. Since the input end of the NOR circuit 224 is held at a low level by the closed loop circuit composed of the inverter 222 and the transistors 227 and 228, the output of the NOR circuit 224 is inverted to a high level. As a result, the signal RF and $\overline{RF}$ are inverted again to a high level and a low level, respectively. Since the signal TC, inverted to a high level, is supplied to the NAND circuit 238, the signal INTRF is inverted to a low level. However, the NOR circuit 225 receives a low level signal at one input, and hence the transistors 220 and 221 are maintained in a nonconducting state.

Since the signal RF is inverted again to a high level, the transistors 267 and 268 (FIG. 5) are made nonconducting, and the transistors 269 and 270 are made conducting. Accordingly, the contents of the internal address counter 110, increased by one, are supplied to the row decoder 20 as row address signals. The signal RAS1 from the NAND circuit 253 (FIG. 4) is held at a high level by the low level signal $\overline{RF}$. Consequently, the next word line is selected by the row decoder 20, and the memory cells connected to the selected word line are refreshed.

When the test signal TC is inverted to a low level as described above, the signal $\overline{CASA}$ from the NOR circuit 264 (FIG. 4) is inverted to a high level, so that the CAS-family signal generating circuit 265, the column decoder 50, and the writetiming circuit 160 are deactivated. As a result, the contents of the internal address counter 110 are not latched into the column decoder 50 as column address signals, and the digit line is not selected. The data write operation and the data read-out operation are also not carried out. Therefore, the terminal $\overline{WE}$ may take either a low level or a high level, as shown in FIG. 6.

Since the signal INTRF is inverted to a low level, the timer circuit 100 is deactivated. Since the signal INTRF is inverted to a low level, the timer circuit 100 is deactivated. When the signal RF is inverted into a high level, the signal RFEND is inverted to a high level after a time (determined by the delay circuit 241 and the gate circuits 242 and 244) has elapsed. Consequently, as mentioned above, the signal RF is inverted to a low level to make the transistors 267 and 268 conducting and the transistors 269 and 270 nonconducting in the address multiplexer 10 of FIG. 5. After the transistors 269 and 270 are made nonconducting, the content of the internal address counter 110 is further increased by one. In addition, the NAND circuit (FIG. 4) inverts the signal RASI to a low level, so that the RAS-family signal generating circuit 255 is deactivated.

Since the NOR circuit 224 (FIG. 3) generates at its output end a low level, the transistors 220 and 221 are made conducting, and the transistor 227 is made nonconducting. Consequently, the high level at the terminal $\overline{RFSH}$ is applied to the input end of the inverter 222 to turn the transistor 228 off. The high level at the terminal $\overline{RFSH}$ further makes the transistor 233 conducting, so that a low level signal is held in the F/F circuit 235.

The above description is the circuit operation of one cycle in the test mode.

When the circuit operation of one cycle in the test mode is completed, the terminal $\overline{RFSH}$ is inverted again to a low level and the terminal $\overline{RAS}$ is also inverted to a low level before the signal FE is changed to a high level, as shown in FIG. 6. Consequently, the memory device is brought into a test mode, and the data "1" is written into another memory cell disposed on the diagonal of the memory cell array 30 and on the intersection of the word line and digit line respectively selected by the row and column decoders 20 and 50 in response to the further increased content of the internal address counter 110. By repeating one cycle operation in the test mode, the data "1" is written into alternate memory cells each of which is disposed on the diagonal of the memory cell array 30.

When the data-write operation in the test mode is completed, the content of the internal address counter 110 returns to the initial value, and the data read-out operation in the test mode is then carried out. In the data read-out operation; the write-enable terminal $\overline{WE}$ held at a high level when the test signal TC is changed to level, as shown in FIG. 6. Accordingly, the write-timing circuit 160 generates the high level signal RE and the low level signal WE. As a result, the data ouput buffer 60 is enabled in response to the signal RE, and the data stored in the memory cell designated by the row and column decoders 20 and 50 is read out from the data output terminal $D_{OUT}$. It is apparent from the above description that the designated memory cell is disposed on the diagonal of the memory cell array 30. Further, the memory cell designated upon the data read-out operation in the test mode is the same as the memory cell designated upon the data-write operation in the test mode. By continuing the data read-out operation, the data stored inthe alternate memory cells (disposed on the diagonal of the memory cell array 30) are read out.

In the refresh timing circuit 90 shown in FIG. 3 by employing such a circuit construction that the signal RF is not changed to a high level when the refresh-request signal RFQ is generated from the timer circuit 100, only one memory cell is designated within one cycle of the test mode. Accordingly. a "1" is written into all of the memory cells disposed on the diagonal of the memory cell array 30, and the data stored in those memory cells are read out.

The above-mentioned data-write and data read-out testing operations are carried out by using the test timing circuit 130 to control the internal refresh circuit consisting of the refresh timing circuit 90, the timer circuit 100 and the internal address counter 110 and the respective timing circuits 140, 150 and 160. If the same data as those written into the memory cells in the data-write operation are read out by carrying out the data read-out operation, it is judged that the internal refresh circuit operates accurately. In addition the operational testing of the interal refresh circuit is completed quickly. More specifically, one cycle period of the test mode depends on the cycle period of the refresh-request signal RFQ generated by the timer circuit 100, as shown in FIG. 6. The cycle period of the signal RFQ is generally set to be 20 to 30 $\mu$sec. Assuming that the memory device shown in FIG. 1 has a memory capacity of 64 K bits, 256 memory cells are disposed on the diagonal of the memory cell array 30. According to the preferred embodiment of the present invention, two memory cells are designated in one cycle period of the test mode. Accordingly, data is actually written into 128 memory cells. The test of the internal refresh circuit is completed by carrying out both the data-write and the data read-out operations. As a result, it only takes about 8 msec $\approx 30$ $\mu$sec $\times 128 \times 2$) to test the internal refresh circuit. Even if the data is written into all the memory cells disposed on the diagonal of the array 30, the test time is about 16 msec.

The present invention has the further advantage of checking the cycle period of the self-refresh operation employing the internal refresh circuit. The self-refresh operation is carried out in synchronism with the refresh-request signal RFQ. As apparent from FIG. 6, if the cycle period of the signal supplied to the terminal $\overline{RFSH}$ is shorter than that of the signal RFQ, the test signal TC is not generated in each cycle period. Consequently, the data is not written into the memory cells disposed on the diagonal of the array 30. Thus, by changing the cycle period of the signal applied to the terminal $\overline{RFSH}$, the cycle period of the signal RFQ, i.e., the cycle period of the selfrefresh operation is checked.

The present invention is characterized in that in a test mode, the content of the internal address counter is supplied to both of row and column decoders to designate the memory cell disposed on the diagonal of the memory cell array, and the data is written into the designated memory cell and read out from the same cell. Therefore, the present invention is not limited to the above-mentioned embodiment, but can be employed in other circuit constructions without departing from the scope and spirit of the present invention. For example, the memory device may be brought into a test mode by supplying a signal to at least one terminal other than the terminals $\overline{RFSH}$ and $\overline{RAS}$. For this purpose, at least one of the terminals $\overline{CAS}$ and $A_0$ to $A_7$ can be used. If desired, new terminals for a test mode may be provided in the memory device. The write-timing circuit 160 may be activated by the test signal TC. The memory cell array 30 may be divided into a plurality of sections. In the data-write operation in the test mode, the data "0" may be stored. The memory device shown in the embodiment of the present invention is of a multi-address type in which row and column address signals are supplied to the same address input terminals and are introduced into the device in synchronism with row and column address strobe signals, respectively. The present invention is applicable to the memory device having two sets of address input terminals, one of which is supplied with row address signals and the other of which is supplied with column address signals.

Figure 7A:
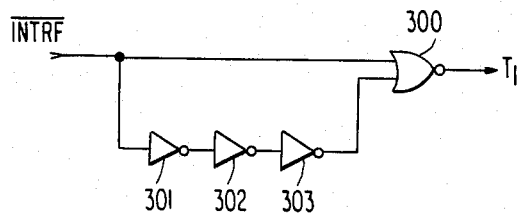
FIGS. 7A and 7B are circuit diagrams showing one-shot pluse generators 201 and 216 in FIG. 2.

FIG. 7A is a circuit diagram showing the one-shot pulse generator 201 shown in FIG. 2. The signal $\overline{INTRF}$ is further supplied to one input end of a NOR circuit 300, and further supplied to the other input end of the NOR circuit 300 through three inverters 301 to 303 serving as a delay circuit. Accordingly, a one-shot pulse $T_1$ is outputted from the NOR circuit 300 when the signal $\overline{INTRF}$ is changed to a low level.

Figure 7B:
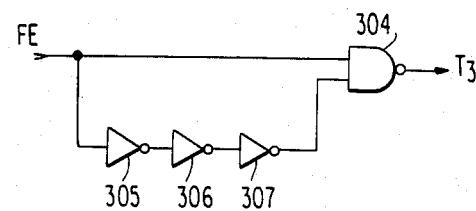
Figure 8A:
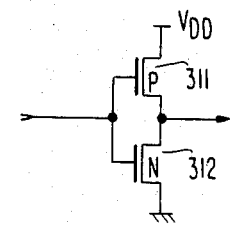
FIGS. 8A, 8B, 8C and 8D are circuit diagrams respectively showing an inverter, a NAND circuit, a NOR circuit, and a flip-flop circuit in FIGS. 2 to 7.
Figure 8B:
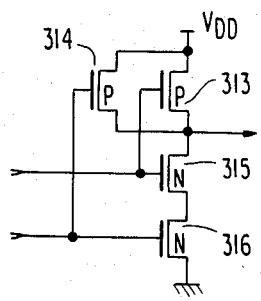
Figure 8C:
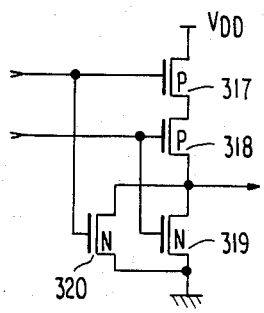
Figure 8D:
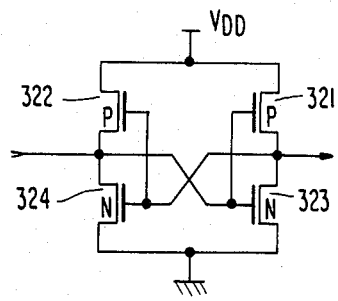

The one-shot pulse generator 216 of FIG. 2 is shown in FIG. 7B. A NAND circuit 304 has the signal FE as one input, and the inverted signal FE (through three inverters 305 to 307 as a delay circuit) as the other input. When the signal FE is inverted to a high level, a one-shot pulse $T_3$ is outputted from the NAND circuit 304.

The circuit diagrams of the inverter, NAND circuit, NOR circuit, and F/F circuit in FIGS. 2 to 7 are shown in FIGS. 8A, 8B, 8C and 8D, respectively. The inverter is composed of P-channel and N-channel MOS transistors 311 and 312 connected in series. The NAND circuit includes two P-channel MOS transistors 313 and 314 connected in parallel and two N-channel MOS transistors 315 and 316 connected in series. The NOR circuit includes two P-Channel MOS transistors 317 and 318 connected in series and two N-channel MOS transistors 319 and 320 connected in parallel. The F/F circuit includes two P-channel MOS transistors 321 and 322 and two N-channel MOS transistors 323 and 324.

What is claimed is:

1. A memory device comprising a memory cell array having a plurality of memory cells, a row address decoder selecting one word line in said memory cell array in response to row address signals, a column address decoder selecting one digit line in said memory cell array in response to column address signals, an internal refresh circuit having an address counter and a timer circuit, said timer circuit operatively producing a refresh request signal in a self-refresh mode, said internal refresh circuit responsive to said refresh request siqnal for refreshing the memory cells connected to the word line selected by said row address decoder according to the content of said address counter, a test timing circuit for generating a test signal in a test mode, means responsive to said test signal for supplying both of said row and column decoders with the content of said address counter as said row and column address signals to designate one of said plurality of memory cells, means responsive to said test signal for activating said timer circuit to produce said refresh request signal, means for writing data into said designated one of said plurality of memory cells, means for reading out data from said designated one of said plurality of memory cells, and means responsive to said refresh request signal for resetting said test timing circuit to stop generation of said test signal.

2. A memory device comprising a memory cell array having a plurality of word lines, a plurality of digit lines, and a plurality of memory cells coupled between the respective word lines and the respective digit lines, a row address decoder responsive to row address signals selecting one of said word lines, a column address decoder responsive to column address signals selecting one of said digit lines, a row address strobe terminal for receiving a row address strobe signal, a column address strobe terminal for receiving a column address strobe signal, a refresh terminal for receiving a refresh signal, a test circuit coupled to said row address strobe terminal and said refresh terminal for operatively generating a plurality of test signals in response to a sequence of said row address strobe signal and said refresh signal, means responsive to said test signals for activating both of said row and column address decoders without said column address strobe signal being received by said column address strobe terminal, an address counter generating internal address signals, and means for supplying said internal address signals generated from said address counter to both of said row and column decoders activated by said activating means to designate one of said memory cells.

3. The memory device of claim 2, further comprising a write-enable terminal supplied with a write-enable signal taking either one of first and second levels, a data input terminal supplied with data, means coupled to said data input terminal and responsive to said first level of said write-enable signal for writing said data supplied to said data input terminal into the designated memory cell, a data output terminal, and means coupled to said data output terminal and responsive to said second level of said write-enable signal for reading out the data stored in said designated memory cell to said data output terminal.

4. A memory device comprising a memory cell array, a row decoder, a column decoder an address counter, first and second terminals, first means coupled to said first and second terminals for producing a test signal, second means coupled to said first terminal for supplying the content of said address counter to said row and column address decoders, third means coupled to said second means for activating said row address decoder, fourth means responsive to said test signal for activating said column address decoder, a third terminal, fifth means coupled to said fourth means and said third terminal for producing a write-enable signal and a read-enable signal, either one of said write-enable and read-enable signals taking an activating level, sixth means responsive to said write-enable signal for writing data into the memory cell that is designated by said row and column address decoders in response to the content of said address counter, and seventh means responsive to said read-enable signal for reading out data stored in the memory cell that is designated by said row and column address decoders in response to the content of said address counter.

5. A test circuit provided in a memory device for producing a test signal by which an internal refresh circuit provided in said memory device is tested, comprising a first pulse generator generating a first pulse signal in response to a first signal, said first signal being produced in synchronism with a first external signal supplied to said memory device, a first transmission gate controlled by said first pulse signal and having an input end supplied with a second signal, said second signal being produced in synchronism with a second external signal supplied to said memory device, a first flip-flop circuit connected to an output end of said first transmission gate, a second pulse generator generating a second pulse signal in response to a third signal, said third signal being produced in synchronism with an internal signal generated in said memory device, a second transmission gate controlled by said second pulse signal and having an input end supplied with the inverted signal of said second signal, a second flip-flop circuit connected to an output end of said second transmission gate, means for resetting said first and second flip-flop circuits, and a gate circuit connected to the output ends of said first and second transmission gates to produce said test signal.

6. A method for testing the operation of an internal refresh circuit of a memory device comprised of a memory cell array having a plurality of memory cells, a row address decoder selecting one word line in said memory cell array in response to row address signals, a column address decoder selecting one digit line in said memory cell array in response to column address signals, and said internal refresh circuit for refreshing the contents of said memory cell array, said internal refresh circuit including an internal address counter, said method comprising the following steps:

supplying periodically a test mode clock to said memory device;

connecting the inputs of said row and column address decoders to said internal address counter in response to said test mode clock;

selecting two word lines within each cycle period of said test mode clock, both of said word lines being identified row addresses supplied by said internal address counter;

writing data into a memory cell that is connected between one of said two word lines and a digit line which is identified by a column address supplied by said internal address counter, said data being written into alternate ones of the memory cells which are identified by all row and column addresses supplied by said internal address counter; and reading out the contents of the memory cells into which said data have been written.

7. A method as claimed in claim 6, wherein the contents of said internal address counter are incremented until data have been written into a predetermined number of said memory cells.

8. A method as claimed in claim 6, wherein the contents of said internal address counter are decremented until data have been written into a predetermined number of said memory cells.

9. In a memory device comprising a memory cell array having a plurality of memory cells, a row address decoder selecting one word line in said memory cell array in response to row address signals, a column address decoder selecting one digit line in said memory cell array in response to column address signals, and an internal refresh circuit for refreshing the contents of said memory cell array, said internal refresh circuit having an internal address counter and a timer circuit, the improvement comprising:

means, responsive to an externally applied signal, for generating a test initiation signal for initiating a test of said internal refresh circuit;

means, responsive to said test initiaion means, for disabling the external supply of address signals during said test, and enabling said internal address counter to supply a common address signal to said row and column address decoders;

means, for writing data into the selected memory cell;

means for disabling supply of the contents of said internal address counter to said row and column address decoders after said data has been written;

means for changing the contents of said internal address counter after each writing or reading operation;

means, responsive to said test initiation means, for activating said timer circuit to produce a refresh request signal; and means, responsive to said refresh request signal, for enabling said internal address counter to supply its changed contents to said row address decoder.

10. A memory device as claimed in claim 9, said changing means incrementing the contents of said internal address counter until a predetermined value has been reached.

11. A memory device as claimed in claim 9, said changing means decrementing the contents of said internal address counter until a predetermined value has been reached.

12. A memory device as claimed in claim 9, further comprising means for reading out the content of the selected memory cell.

13. A semiconductor memory comprising a memory cell array having a plurality of memory cells, a row address strobe terminal for receiving a row address strobe signal, a row address strobe timing circuit activated by said row address strobe signal and producing first and second signals, a row address decoder activated by said first signal to select one word line in said memory cell array in response to row address signals, a column address strobe terminal for receiving a column address strobe signal, a column address strobe timing circuit activated by said second signal and said column address strobe signal to produce third and fourth signals, a column address decoder activated by said third signal to select one digit line in said memory cell array in response to column address signals, a refresh terminal for receiving a refresh signal, an internal refresh circuit having a refresh timing circuit, an internal address counter and a timer circuit, said refresh timing circuit being activated by said refresh signal to produce fifth and sixth signals, means responsive to said fifth signal for supplying the content of said internal address counter to both of said row and column address decoders as said row and column address signals, means responsive to said fifth signal for activating said row address strobe timing circuit irrespective of said row address strobe signal to produce said first and second signals, said timer circuit producing a refresh request signal when said sixth signal is produced over a predetermined period of time, a test timing circuit generating a test signal when said row address strobe signal is supplied to said row address strobe terminal after said refresh signal is supplied to said refresh terminal, means responsive to said test signal for activating said column address strobe timing circuit without said column address strobe signal being applied to said column address strobe terminal, to produce said third and fourth signals, a write-enable terminal supplied with a write-enable signal, a write-timing circuit activated by said fourth signal to produce a writing signal when said write-enable signal takes a first level and a reading signal when said write-enable signal takes a second level, a data input circuit activated by said writing signal and writing data into one of said memory cells designated by said row and column address decoders in response to the content of said internal address counter, a data output circuit activated by said reading signal and reading out data stored in the designated memory cell, the content of said internal address counter being changed after the data is written into or read out from the designated memory cell, means responsive to said test signal for maintaining said sixth signal to enable said timer circuit to produce said refresh request signal, and means responsive to said refresh request signal for terminating the generation of said test signal, whereby a self-refresh operation by said internal refresh circuit is tested.

* * * * *

UNITED STATES PATENT AND TRADEMARK OFFICE
CERTIFICATE OF CORRECTION

PATENT NO. : 4,672,583

DATED : June 9, 1987

INVENTOR(S) : NAKAIZUMI, Kazuo

It is certified that error appears in the above-identified patent and that said Letters Patent is hereby corrected as shown below:

| | |
|---|---|
| ABSTRACT, LINE 4 | Delete "the row of column" insert -- of row and column -- |
| ABSTRACT, LINE 8 | Delete "of" |
| COLUMN 1, LINE 29 | Delete "$\overline{RAS}$ - refresh" insert -- $\overline{RAS}$ - only refresh -- |
| COLUMN 3, LINE 47 | After "Accordingly" delete "." insert a comma --,-- |
| COLUMN 4, LINE 55 | Delete "." insert -- , -- |
| COLUMN 4, LINE 59 | Delete "." insert -- , -- |
| COLUMN 8, LINE 27 | After "through" insert -- two inverters -- |
| COLUMN 8, LINE 42 | Delete "AL" insert --AL' -- |
| COLUMN 8, LINE 43 | Delete "AL" insert --AL'-- |
| COLUMN 8, LINE 49 | Delete "AXS" insert -- AXS' -- |
| COLUMN 9, LINE 2 | Delete "AL" insert -- AL' -- |
| COLUMN 10, LINE 11 | Delete "pk" |
| COLUMN 10, LINE 46 | After "level" insert -- signal -- |
| COLUMN 10, LINE 58 | After "is" insert -- set -- |
| COLUMN 13, LINE 53 | After "$\overline{WE}$" insert -- is -- |

UNITED STATES PATENT AND TRADEMARK OFFICE
CERTIFICATE OF CORRECTION

PATENT NO. : 4,672,583
DATED : June 9, 1987
INVENTOR(S) : NAKAIZUMI, Kazuo

It is certified that error appears in the above-identified patent and that said Letters Patent is hereby corrected as shown below:

COLUMN 13, LINE 54    After "to" insert -- a high --

COLUMN 14, LINE 34    After "msec" insert -- ( --

COLUMN 16, LINE 36    After "a column decoder" insert -- , --

Signed and Sealed this

Sixteenth Day of August, 1988

Attest:

DONALD J. QUIGG

Attesting Officer

Commissioner of Patents and Trademarks